(12) United States Patent
Nishimoto

(10) Patent No.: US 9,907,163 B2
(45) Date of Patent: Feb. 27, 2018

(54) FLEXIBLE CIRCUIT BOARD AND DISPLAY DEVICE

(71) Applicant: Japan Display Inc., Minato-ku (JP)

(72) Inventor: Yuuki Nishimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/418,991

(22) Filed: Jan. 30, 2017

(65) Prior Publication Data
US 2017/0273177 A1   Sep. 21, 2017

(30) Foreign Application Priority Data

Mar. 18, 2016   (JP) ................. 2016-055701

(51) Int. Cl.
| | |
|---|---|
| *H05K 1/02* | (2006.01) |
| *H05K 1/18* | (2006.01) |
| *H05K 1/11* | (2006.01) |

(52) U.S. Cl.
CPC ......... *H05K 1/0281* (2013.01); *H05K 1/0271* (2013.01); *H05K 1/115* (2013.01); *H05K 1/189* (2013.01); *H05K 2201/068* (2013.01); *H05K 2201/10128* (2013.01)

(58) Field of Classification Search
CPC .... H05K 1/0281; H05K 1/0271; H05K 1/115; H05K 1/189
USPC ........................................ 361/749
See application file for complete search history.

(56) References Cited

U.S. PATENT DOCUMENTS

| | | | | |
|---|---|---|---|---|
| 7,728,102 | B2 * | 6/2010 | Kurita | B32B 15/08 528/310 |
| 2006/0102386 | A1 * | 5/2006 | Morimoto | H05K 3/4046 174/260 |
| 2006/0268213 | A1 * | 11/2006 | Kang | G02F 1/13452 349/149 |

FOREIGN PATENT DOCUMENTS

| | | |
|---|---|---|
| JP | 2001-223446 | 8/2001 |
| JP | 2013-38154 | 2/2013 |

* cited by examiner

*Primary Examiner* — Timothy Thompson
*Assistant Examiner* — Charles Pizzuto
(74) *Attorney, Agent, or Firm* — Oblon, McClelland, Maier & Neustadt, L.L.P.

(57) ABSTRACT

A flexible circuit board includes a base material including a first surface and a second surface opposite the first surface, the base material including a conductor layer, a first insulating film covering the first surface of the base material and formed with a first opening, a first insulating member formed inside the first opening and formed with a connection port to expose the conductor layer, the first insulating member having a thermal expansion coefficient smaller than that of the first insulating film, a second insulating film covering the second surface of the base material and formed with a second opening overlapping at least a portion of the first opening in a plan view, and a second insulating member formed inside the second opening and having a thermal expansion coefficient smaller than that of the first insulating film.

6 Claims, 3 Drawing Sheets

FLEXIBLE CIRCUIT BOARD AND DISPLAY DEVICE

CROSS-REFERENCE TO RELATED APPLICATION

The present application claims priority from Japanese application JP2016-055701 filed on Mar. 18, 2016, the content of which is hereby incorporated by reference into this application.

BACKGROUND OF THE INVENTION

1. Field of the Invention

The present invention relates to a flexible circuit board and a display device.

2. Description of the Related Art

JP 2013-38154 A discloses a flexible circuit board (FPC), on one surface of which an electronic component is mounted and to the other surface of which a reinforcing plate is bonded.

SUMMARY OF THE INVENTION

In recent years, it has been performed to provide a patterned cured resin product, called a resist, inside an opening formed in an insulating film at a surface layer of a flexible circuit board and then mount an electronic component on the patterned cured resin product. However, it has been found that warpage occurs in the flexible circuit board due to heat in mounting the electronic component.

For suppressing the occurrence of warpage, the reinforcing plate may be conceivably bonded to the other surface as disclosed in JP 2013-38154 A. In that case, however, the flexible circuit board is thickened as a whole, which is disadvantageous in terms of routing.

The invention has been made in view of the problem described above, and it is an object of the invention to provide a flexible circuit board capable of suppressing an increase in thickness while suppressing the occurrence of warpage, and a display device.

A flexible circuit board includes a base material including a first surface and a second surface opposite the first surface, the base material including a conductor layer, a first insulating film covering the first surface of the base material and formed with a first opening, a first insulating member formed inside the first opening and formed with a connection port to expose the conductor layer, the first insulating member having a thermal expansion coefficient smaller than that of the first insulating film, a second insulating film covering the second surface of the base material and formed with a second opening overlapping at least a portion of the first opening in a plan view, and a second insulating member formed inside the second opening and having a thermal expansion coefficient smaller than that of the first insulating film.

DETAILED DESCRIPTION OF THE INVENTION

Figure 1:
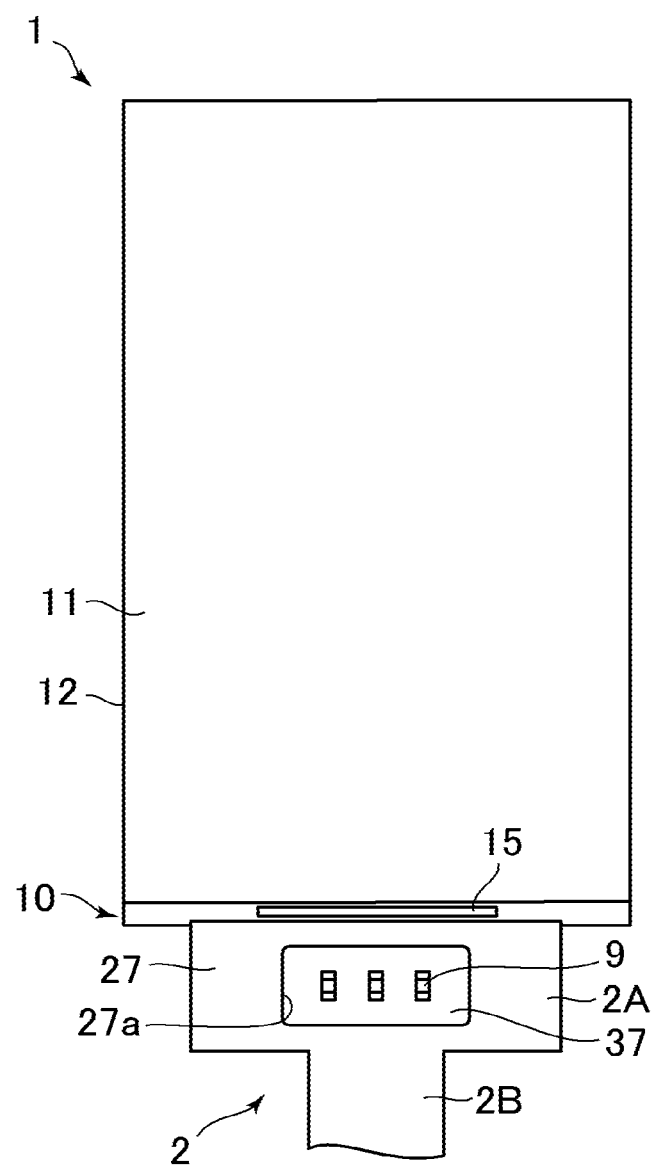
FIG. 1 is a plan view of a flexible circuit board and a display device according to an embodiment of the invention.

Hereinafter, the embodiment of the invention will be described with reference to the drawings. The disclosure is illustrative only. Appropriate modifications that will readily occur to those skilled in the art and fall within the spirit of the invention are of course included in the scope of the invention. For more clarity of description, the width, thickness, shape, and the like of each part may be schematically represented in the drawings, as compared with those in the embodiment. However, they are illustrative only and do not limit the interpretation of the invention. Moreover, in the specification and the drawings, elements similar to those described in relation to a previous drawing are denoted by the same reference numerals and signs, and a detailed description may be appropriately omitted.

Figure 2:
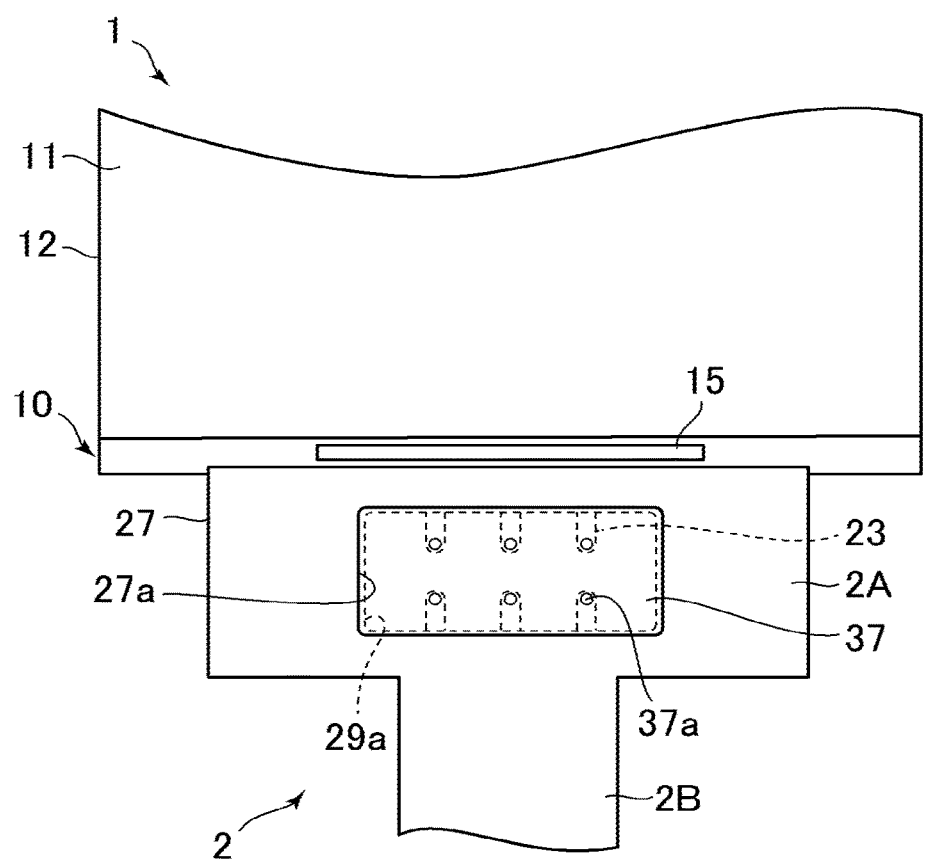
FIG. 2 is an enlarged view of a main portion of FIG. 1.
Figure 3:
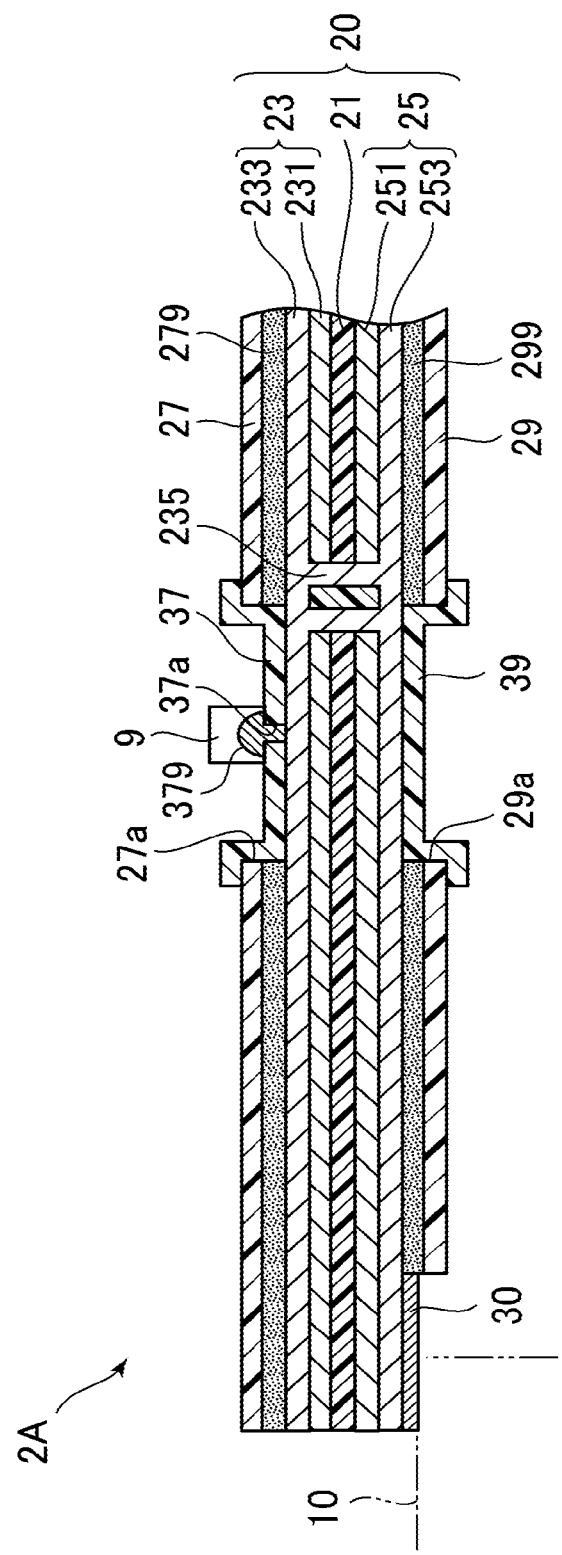
FIG. 3 is a cross-sectional view of the flexible circuit board.

FIG. 1 is a plan view of a flexible circuit board 2 and a display device 1 according to the embodiment of the invention. FIG. 2 is an enlarged view of a main portion of FIG. 1. In FIG. 2, electronic components 9 are not illustrated. FIG. 3 is a cross-sectional view schematically showing a cross-sectional structure of the flexible circuit board 2.

The display device 1 is, for example, an organic EL display device including an organic light-emitting element (OLED). The display device 1 includes an array substrate 11 and a counter substrate 12 facing the array substrate 11. The array substrate 11 is, for example, a substrate in which pixel circuits arranged in a matrix, and the like are formed on a glass substrate. The counter substrate 12 is, for example, a substrate in which color filters corresponding to the pixel circuits, and the like are formed on a glass substrate.

Each of the array substrate 11 and the counter substrate 12 has a rectangular shape, and with respect to one side of four sides, the edge of the array substrate 11 projects outward beyond the edge of the counter substrate 12. With this configuration, a non-facing region 10 that does not face the counter substrate 12 is formed on the array substrate 11. An IC chip 15 is mounted in the non-facing region 10. The IC chip 15 includes a circuit that drives the pixel circuits formed in the array substrate 11.

Terminals (not shown) are formed between the IC chip 15 and the edge of the array substrate 11 in the non-facing region 10. The flexible circuit board (FPC) 2, which transmits signals to be supplied to the IC chip 15, is connected to the terminals. Hereinafter, a specific configuration of the flexible circuit board 2 will be described. In the following description, in the thickness direction, the direction of the counter substrate 12 with respect to the array substrate 11 is defined as an upper side or a front side, and the opposite direction is defined as a lower side or a rear side.

The flexible circuit board 2 includes a rectangular connection portion 2A connected to the terminals formed in the non-facing region 10, and an extending portion 2B extending from the connection portion 2A. The electronic components 9 such as a capacitor and a resistor are mounted on the upper surface of the connection portion 2A. Terminals 30 connected to the terminals in the non-facing region 10 are formed on the lower surface of the edge portion of the connection portion 2A.

The flexible circuit board 2 includes a base 21 in the form of film formed of an insulating resin material such as polyimide. A conductor layer 23 is disposed in the upper direction of the base 21, and a conductor layer 25 is disposed in the lower direction of the base 21. The base 21 and the conductor layers 23 and 25 constitute a base material 20. The base material 20 is one example of "a base material including a conductor layer". The conductor layer 23 includes a metal foil 231 covering the upper surface of the base 21 and formed of a conductive metal material such as copper, and a plating layer 233 formed on the upper surface of the metal foil 231 and formed of a conductive metal material such as copper. Similarly, the conductor layer 25 includes a metal foil 251 and a plating layer 253. The plating layers 233 and 253 are connected to each other through a through-hole conductor 235 penetrating the base 21 and the metal foils 231 and 251.

A front-side coverlay 27 formed of an insulating resin material such as polyimide, which is one example of a first insulating film, is disposed in the upper direction of the conductor layer 23. The front-side coverlay 27 is bonded to the upper surface (i.e., the upper surface of the base material 20) of the conductor layer 23 via an adhesive layer 279, and covers the upper surface of the conductor layer 23. A rear-side coverlay 29 formed of an insulating resin material such as polyimide, which is a second insulating film, is disposed in the lower direction of the conductor layer 25. The rear-side coverlay 29 is bonded to the lower surface (i.e., the lower surface of the base material 20) of the conductor layer 25 via an adhesive layer 299, and covers the lower surface of the conductor layer 25.

An opening 27a, which is one example of a first opening, is formed in the front-side coverlay 27. The opening 27a has, for example, a rectangular shape with rounded corners. The opening 27a is formed by, for example, punching using a die. The base 21 and the conductor layer 23 are exposed at the bottom of the opening 27a.

A front-side resist portion 37, which is one example of a first insulating member, is provided inside the opening 27a formed in the front-side coverlay 27. The front-side resist portion 37 is, for example, a cured resin product obtained by applying and curing a liquid solder resist including an insulating resin material such as epoxy resin and having photocurability or thermosetting property. For this reason, the front-side resist portion 37 has low flexibility and a small thermal expansion coefficient as compared with the front-side coverlay 27.

The front-side resist portion 37 covers, not only the base 21 or the conductor layer 23 exposed at the bottom of the opening 27a, but also an inner wall that forms the opening 27a of the front-side coverlay 27 or a peripheral edge portion of the opening 27a in the upper surface of the front-side coverlay 27.

The front-side resist portion 37 is patterned by exposure and development using a photomask, and thus connection ports 37a with the conductor layer 23 being as the bottom are formed. The electronic components 9 are disposed on the upper surface of the front-side resist portion 37. The electronic component 9 is electrically connected to the conductor layer 23 through a solder 379 that fills the connection port 37a.

An opening 29a, which is one example of a second opening, is formed in the rear-side coverlay 29. Similarly to the opening 27a of the front-side coverlay 27, the opening 29a is formed by, for example, punching using a die. At least one of the base 21 and the conductor layer 25 is exposed at the bottom of the opening 29a.

The opening 29a of the rear-side coverlay 29 overlaps at least a portion of the opening 27a of the front-side coverlay 27 as viewed in the thickness direction. In the embodiment, the opening 27a of the front-side coverlay 27 and the opening 29a of the rear-side coverlay 29 are formed in the same shape having the same area, and coincide with each other as viewed in the thickness direction. In FIG. 2, the broken line representing the opening 29a of the rear-side coverlay 29 is drawn slightly apart from the solid line representing the opening 27a of the front-side coverlay 27 for illustrative purposes.

The opening 29a of the rear-side coverlay 29 may be contained inside the opening 27a of the front-side coverlay 27 as viewed in the thickness direction, or may contain all of the opening 27a of the front-side coverlay 27.

A portion or all of the edge of the opening 29a of the rear-side coverlay 29 may be close in parallel to the edge of the opening 27a of the front-side coverlay 27 as viewed in the thickness direction. For example, with respect to a portion or all of the four sides constituting the rectangular shape, the edge of the opening 29a of the rear-side coverlay 29 may be close in parallel to the edge of the opening 27a of the front-side coverlay 27 as viewed in the thickness direction.

Moreover, a portion or all of the edge of the opening 29a of the rear-side coverlay 29 may coincide with the edge of the opening 27a of the front-side coverlay 27 as viewed in the thickness direction. For example, with respect to a portion or all of the four sides constituting the rectangular shape, the edge of the opening 29a of the rear-side coverlay 29 may coincide with the edge of the opening 27a of the front-side coverlay 27 as viewed in the thickness direction.

The area of the opening 29a of the rear-side coverlay 29 is preferably the same as that of the opening 27a of the front-side coverlay 27 even when the shape, or the position of the edge, of the opening 29a of the rear-side coverlay 29 is different from that of the opening 27a of the front-side coverlay 27.

A rear-side resist portion 39, which is one example of a second insulating member, is provided inside the opening 29a formed in the rear-side coverlay 29. Similarly to the front-side resist portion 37, the rear-side resist portion 39 is, for example, a cured resin product obtained by applying and curing a liquid solder resist, and has low flexibility and a small thermal expansion coefficient as compared with the front-side coverlay 27. The material of the rear-side resist portion 39 is preferably the same as that of the front-side resist portion 37.

In the embodiment, the material of the rear-side resist portion 39 is the same as that of the front-side resist portion 37. However, the material is not limited to this, and may be different from that of the front-side resist portion 37 as long as the material has a thermal expansion coefficient smaller than that of the front-side coverlay 27.

Similarly to the front-side resist portion 37, the rear-side resist portion 39 covers, not only the base 21 or the conductor layer 25 exposed at the bottom of the opening 29a, but also an inner wall that forms the opening 29a of the rear-side coverlay 29 or a peripheral edge portion of the opening 29a in the upper surface of the rear-side coverlay 29.

Unlike the front-side resist portion 37, the rear-side resist portion 39 is not patterned, and an electronic component is not mounted on the lower surface of the rear-side resist portion 39.

In the embodiment described above, the opening 29a overlapping at least a portion of the opening 27a of the front-side coverlay 27 as viewed in the thickness direction is formed in the rear-side coverlay 29, and also, the rear-side resist portion 39 having a thermal expansion coefficient smaller than that of the front-side coverlay 27 is provided inside the opening 29a. According to this configuration, even when heat for melting the solder 379 in mounting the electronic component 9 on the front-side resist portion 37 is applied, the occurrence of warpage in the flexible circuit board 2 can be suppressed.

Especially, for making the thermal expansion coefficients of the front and rear sides of the flexible circuit board 2 closer to each other, the area of the opening 29a of the rear-side coverlay 29 where the rear-side resist portion 39 is provided is preferably the same as that of the opening 27a of the front-side coverlay 27 where the front-side resist portion 37 is provided. According to this configuration, the occurrence of warpage in the flexible circuit board 2 can be easily suppressed.

Moreover, for making the thermal expansion coefficients of the front and rear sides of the flexible circuit board 2 closer to each other, the material of the rear-side resist portion 39 provided at the opening 29a of the rear-side coverlay 29 is preferably the same as that of the front-side resist portion 37 provided at the opening 27a of the front-side coverlay 27. According to this configuration, the occurrence of warpage in the flexible circuit board 2 can be easily suppressed.

In the embodiment, the organic EL display device has been illustrated as an example of the disclosure. However, other application examples include all flat panel-type display devices such as a liquid crystal display device, other self-emitting-type display devices, and an electronic paper-type display device including an electrophoretic element. Moreover, it is needless to say that the invention is applicable to small or medium to large-sized display devices without particular limitation.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A flexible circuit board comprising:
   a base material including a first surface and a second surface opposite the first surface, the base material including a conductor layer;
   a first insulating film covering the first surface of the base material and formed with a first opening;
   a first insulating member formed inside the first opening and formed with a connection port to expose the conductor layer, the first insulating member having a thermal expansion coefficient smaller than that of the first insulating film;
   a second insulating film covering the second surface of the base material and formed with a second opening overlapping at least a portion of the first opening in a plan view; and
   a second insulating member formed inside the second opening and having a thermal expansion coefficient smaller than that of the first insulating film.

2. The flexible circuit board according to claim 1, wherein an area of the second opening is the same as that of the first opening.

3. The flexible circuit board according to claim 1, wherein a material of the second insulating member is the same as that of the first insulating member.

4. The flexible circuit board according to claim 1, wherein an electronic component electrically connected to the conductor layer through the connection port is mounted on the first insulating member.

5. The flexible circuit board according to claim 1, wherein an electronic component is not mounted on the second insulating member.

6. A display device comprising the flexible circuit board according to claim 1.

* * * * *